United States Patent [19]

Zunino

[11] Patent Number: 4,646,124
[45] Date of Patent: Feb. 24, 1987

[54] LEVEL SHIFTING BIMOS INTEGRATED CIRCUIT

[75] Inventor: Michael J. Zunino, Shrewsbury, Mass.

[73] Assignee: Sprague Electric Company, North Adams, Mass.

[21] Appl. No.: 635,867

[22] Filed: Jul. 30, 1984

[51] Int. Cl.[4] .................... H01L 27/02; H01L 27/04
[52] U.S. Cl. ......................................... 357/43; 357/42; 357/48
[58] Field of Search ..................... 357/42, 43, 47, 48

[56] References Cited

U.S. PATENT DOCUMENTS

| | | | |
|---|---|---|---|
| 4,032,372 | 6/1977 | Vora | 357/42 |
| 4,161,417 | 7/1979 | Yim et al. | 357/42 |
| 4,225,877 | 9/1980 | Miles et al. | 357/43 |
| 4,403,395 | 9/1983 | Curran | 29/571 |
| 4,458,158 | 7/1984 | Mayrand | 307/270 |

Primary Examiner—Martin H. Edlow
Assistant Examiner—Terri M. Henn

[57] ABSTRACT

An integrated circuit has small signal MOS logic transistors formed in an N-type basket which basket itself is formed in an N-type epitaxial pocket that is defined by an enclosing P-type isolation wall. In a second epitaxial pocket a relatively high-current carrying bipolar transistor is formed. The MOS containing N-type basket is tied to one DC voltage which the substrate and isolation walls are connected to a lower level DC voltage. Substrate currents that are caused by the high current in the bipolar transistor are prevented by the N-type basket from inducing voltage changes in the MOS transistors.

4 Claims, 3 Drawing Figures

LEVEL SHIFTING BIMOS INTEGRATED CIRCUIT

BACKGROUND OF THE INVENTION

This invention relates to BIMOS integrated circuits and more particularly to such an integrated circuit wherein the MOS transistors are enclosed in an N-type basket formed by an N-type buried layer and and annular N-type plug, the basket itself being in an N-type epitaxial pocket defined by isolation walls and a P-type substrate.

It is known to combine in an integrated circuit, P-channel and N-channel MOS transistors and both lateral and vertical type NPN and PNP transistors. The MOS transistors are formed in one N-type epitaxial pocket while usually each bipolar transistor is formed in its own separate pocket.

In the MOS pocket, the N-channel transistors are formed in a P-type well region which in most prior art examples extends downward from the epitaxial surface only partway through the epitaxial layer. Thus a slice of lightly N doped epitaxial material is located below the P-well. This, I believe, poses the potentially serious disadvantage that the parasitic PNPN transistor consisting of a substrate, epi-pocket, P-well and N-type source region will be formed which will more easily latch up.

The lightly doped N-type epitaxial slice represents a parasitic-transistor region of high minority carrier concentration and the PNPN will be more easily latched on by stray currents either in the epitaxial material or in the substrate. Such stray currents are more likely to exist when the bipolar transistors are carrying large currents.

This problem is solved in the BIMOS integrated structure disclosed by Miles and Emerald in U.S. Pat. No. 4,225,877, issued Sept. 30, 1980 and assigned to the same assignee as is the present invention. There, a P-type buried layer joins the P-well with the P-type substrate below and destroys the parasitic PNPN transistor. However, this structure can only be operated with the substrate and the P-well at the same voltage.

Although the first above-mentioned BIMOS integrated circuit can be operated with the MOS circuit at a different ground reference potential than that of the bipolar circuit, that difference in reference potentials would be small unless the above-mentioned slice of lightly-doped epitaxial material is made very thick to accomodate the resulting expanded depletion layer therein and also to reduce the gain of the parasitic PNPN transistor enough to prevent latch-up. Thicker epitaxial layers tend to increase the $V_{SAT}$ in the power NPN transistors and limit the current they may safely carry.

It is therefore an object of this invention to provide a BIMOS integrated circuit for operation of the small signal MOS transistors at one DC voltage reference level and operation of relatively high current carrying bipolar transistors at a lower DC voltage reference level.

It is a further object of this invention to provide such an integrated circuit that can be made simply by standard BIMOS processing steps.

SUMMARY OF THE INVENTION

A level shifting BIMOS integrated circuit is formed on a silicon substrate of P-type having an N-type epitaxial layer grown on a face thereof and having electrical components formed in the epitaxial layer including a complementary pair of MOS transistors and at least one bipolar transistor.

The pair of MOS transistors is formed in a first pocket of the epitaxial layer and the bipolar transistor is formed in a second pocket of the epitaxial layer. A system of P-type isolation walls extends through the epitaxial layer to the P-type substrate. At the substrate face there is a first N-type buried layer located under the MOS transistors. An N-type annular plug completely encloses the MOS transistors in a sub-epitaxial pocket formed by the overlapping annular plug and buried layer.

A plurality of conductive members overlies the epitaxial layer. One of the conductive layers contacts the N-type plug and is adapted for connection to on DC voltage. Another and separate conductive member contacts the system of P-type isolation walls and is adapted for connection to another DC voltage. Such adaptions may be comprised of two terminal pads, respectively at which the different DC voltages may be applied from external sources. Alternatively the adaptions may be connections to two on-board DC voltage sources.

The complete enclosure of the MOS transistors within the N-type annular plug and buried layer, provides a highly conductive N-type basket surrounding the MOS transistors, which basket may be connected to a voltage independent of that to which the substrate is connected. When a bipolar transistor in an adjacent pocket is operating at current levels orders of magnitude higher than that carried by the MOS transistors, the resulting changes in substrate voltage due to the currents injected therein from the bipolar transistors, have no effect on the MOS transistors within the N-type basket that is electrically held at the one DC voltage. However, to save room when only moderate NPN currents are drawn, a partial plug may be used but to the extent around the MOS pocket to at least provide very low conductive contact to the N-type buried layer, e.g. no less than half way around.

DESCRIPTION OF THE PREFERRED EMBODIMENTS

Figure 1:
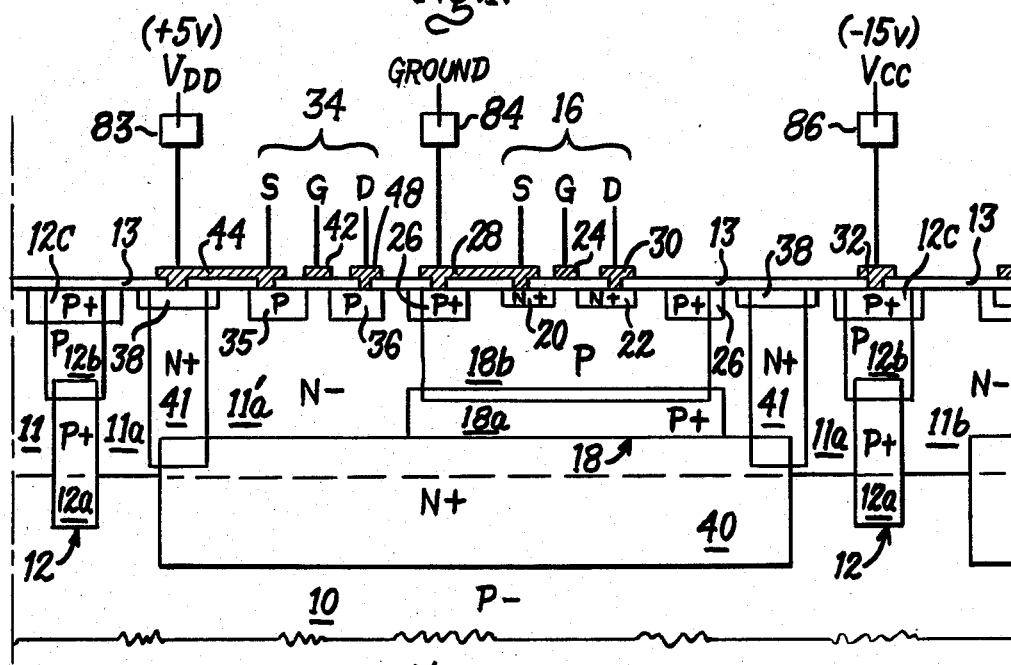
FIG. 1 shows in side sectional view a complementary pair of low power logic MOS transistors formed in a portion of an integrated circuit of this invention.
Figure 2:
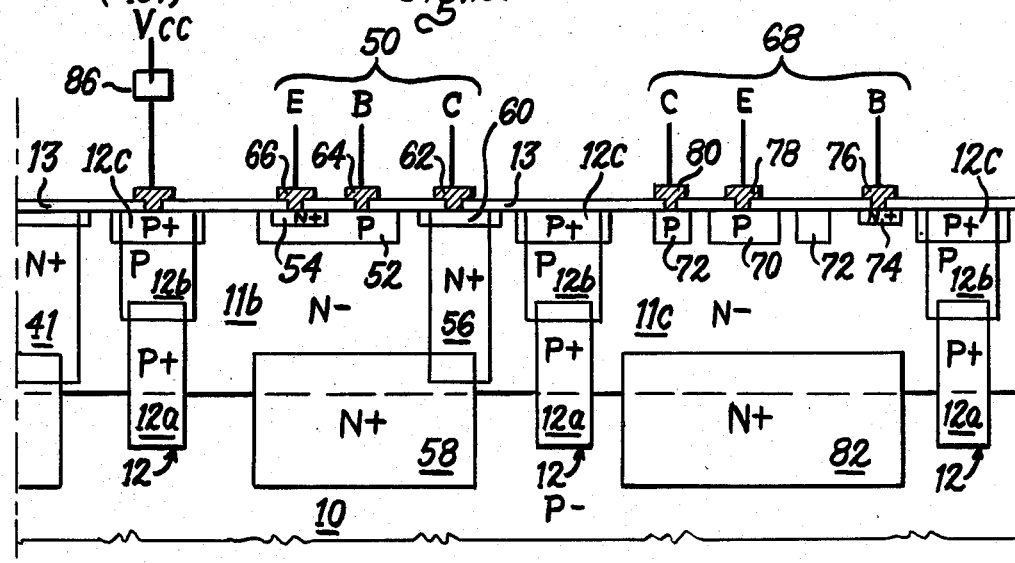
FIG. 2 shows in side sectional view another portion of the integrated circuit in FIG. 1 having a high current NPN transistor and a high current PNP transistor formed therein.

In FIGS. 1 and 2 there are shown a number of components formed on a P-type crystalline silicon chip 10. On the top face of the wafer 10 there has been grown an N-type epitaxial layer 11. The active components shown in FIGS. 1 and 2 are formed in pocket regions, i.e. 11a, 11b and 11c of the epitaxial layer 11. These pocket regions are electrically isolated from one another by P-type isolation walls 12 which extend from the top or outer surface of the epitaxial layer 11 through the epitaxial layer to the chip 10. These walls 12 are comprised of three portions, namely an upwardly extending buried layer portion 12a, a downwardly extending portion 12b that overlaps the buried layer 12a, and a shallow heavily doped contact portion 12c at the surface. A silicon dioxide layer 13 overlies the outer surface of epitaxial layer 11.

An N-channel MOS transistor 16 is shown at the right hand side of FIG. 1, is formed in pocket 11a, that has located centrally therein a P-type well region 18 extending completely through the epitaxial layer pocket 11a. Well-region 18 is comprised of an upwardly extending buried layer portion 18a and a downwardly extending portion 18b that overlaps the buried layer portion 18a.

Two spaced shallow N-type regions 20 and 22 serve as the source and drain regions, respectively. A conductive aluminum film 24 serving as the gate electrode is over the oxide layer 13 and is registered with the space between the source and drain regions 20 and 22. A shallow annular surface region 26 is formed at the interface between the well 18 and the pocket 11a, having a higher concentration of P-type impurities than well portion 18b so as to decrease the resistivity of the P-well there and to prevent inversion at the junction between the P-well and the adjacent pocket 11a. The concentration of N-type impurities in the epitaxial layer 11 is preferably on the order of $10^{15}$ atoms/cm$^3$ to achieve optimum properties in the NPN transistor to be described (FIG. 2). The light concentration of P-type impurities in the well portion 18b is about $5 \times 10^{16}$ atoms/cm$^3$ at the surface to provide the necessary threshold voltage in the N-channel transistor.

Regions 20 and 26 are contacted by aluminum film 28. Drain region 22 is contacted by aluminum conductor 30 and wall 12 is contacted by aluminum conductor 32.

A P-channel MOS transistor 34 as shown at the left hand side of FIG. 1, is also formed in epitaxial pocket 11a, as may be other MOS transistors (not shown). Two spaced shallow P-type regions 35 and 36 serve as the source and drain, respectively. A shallow annular N-type guard ring 38 is formed at the surface of pocket 11a, enclosing at the surface the source and drain regions 35 and 36, and serves as a conventional Chan-stop as well as a low ohmic contact region for the central portion of pocket 11a. An N-type buried layer 40 extends part way into pocket 11a from the wafer 10 beneath the MOS transistors 16 and 34.

An annular N+ plug 41 extends downward from the annular N-type guard ring 38 and overlaps the buried N+ buried layer to form a sub-pocket 11'a within the pocket 11a. The MOS transistors 16 and 34 are formed in sub-pocket 11'a as may be other MOS transistors, (not shown).

The guard ring 38 may not extend completely around the sub-pocket 11'a, but may be present only in areas over which conductors lie that may operate at a more negative voltage than sub-pocket 11'a. On the other hand, it is preferred that the annular N+ plug 41 completely surround pocket 11'a to raise the gate voltage threshold at which the parasitic PNPN transistor formed by regions 10, 11a, 18 and 22 turns on.

When the power transistors, e.g. the NPN transistor 50, is switching several amperes of current, voltages in the substrate 10 change due to relatively large substrate currents that tend to trigger the PNPN transistor to a conducting state which overrides the small logic signals in the MOS transistors. Also, the pocket 11'a may contain many tens or even hundreds of MOS transistors and occupy a large part of the integrated circuit. Therefore, a completely or nearly completely surrounding plug 41 may be essential to more evenly distribute the currents in buried layer 40 to further reduce the possibility of triggering on the parasitic transistor.

A conductive aluminum film 42 serving as the gate electrode lies over the oxide layer 13 and is registered with the space between the source and drain regions 35 and 36. Another aluminum film 44 contacts both the source region 35 and the guard ring 38. Yet another aluminum film 48 contacts the drain region 36.

An NPN transistor 50 as shown in FIG. 2, is formed in the epitaxial pocket 11b. This transistor has a P-type base region 52 centrally located at the surface of the pocket 11b. An N-type emitter region 54 is formed within the base region at the surface. An N-type plug 56 extends from the surface through the epitaxial pocket 11b and overlaps a buried layer 58 that extends from the wafer 10 part way into pocket 11b overlapping the plug 56. A shallow annular region 60 having a high concentration of N-type impurities is superimposed over the plug region 56 at the surface and an aluminum film 62 making contact with region 60 serves as the collector lead for the transistor. Other aluminum films 64 and 66 contact the base region 52 and emitter region 54 respectively.

The plug 56 may partially or completely encircle the base region 52 to prevent inversion of surface portions of pocket 11b that may occur as a result of conductors (not shown) overlying the oxide layer 13 near such surface portions, which conductors may be more negative than the pocket 11b. This is the well known chan-stop function. The plug 56 extending to overlap the buried layer 35 serves to reduce the collector resistance.

A PNP transistor 68 as shown in FIG. 2 is formed in pocket 11c. A shallow P-type region 70 is located at the surface centrally within pocket 11c, serving as the emitter. A shallow annular P-type region 72 is spaced from and surrounds the emitter region 70 at the surface, serving as the collector. A shallow region 74 having a high concentration of N-type impurities lies at the surface outside of and spaced from the annular collector region 72. An aluminum film 76 contacts region 74 and serves as the base lead of the transistor. Other aluminum films 78 and 80 contact the emitter and collector regions 70 and 72, respectively.

An N+ buried layer 82 is formed at the interface between the pocket 11c containing the PNP transistor 68 and the chip substrate 10 to reduce currents by transistor action from being injected into the substrate 10.

The source region 35 and the N+ basket (consisting of guard ring 38, plug 41 and buried layer 40) are shown connected to a terminal pad 83 to which a +5 V DC source is applied. Similarly, source region 20 and the P-well 18 are connected to a terminal pad 84 that is grounded. The isolation walls 12 and P-substrate 10 are connected to a terminal pad 86 to which a −15 V DC source is applied. Thus in effect the MOS transistors 34 and 16 operate at a ground reference level while the adjacent bipolar power transistors operate at a −15 volt reference voltage.

Figure 3:
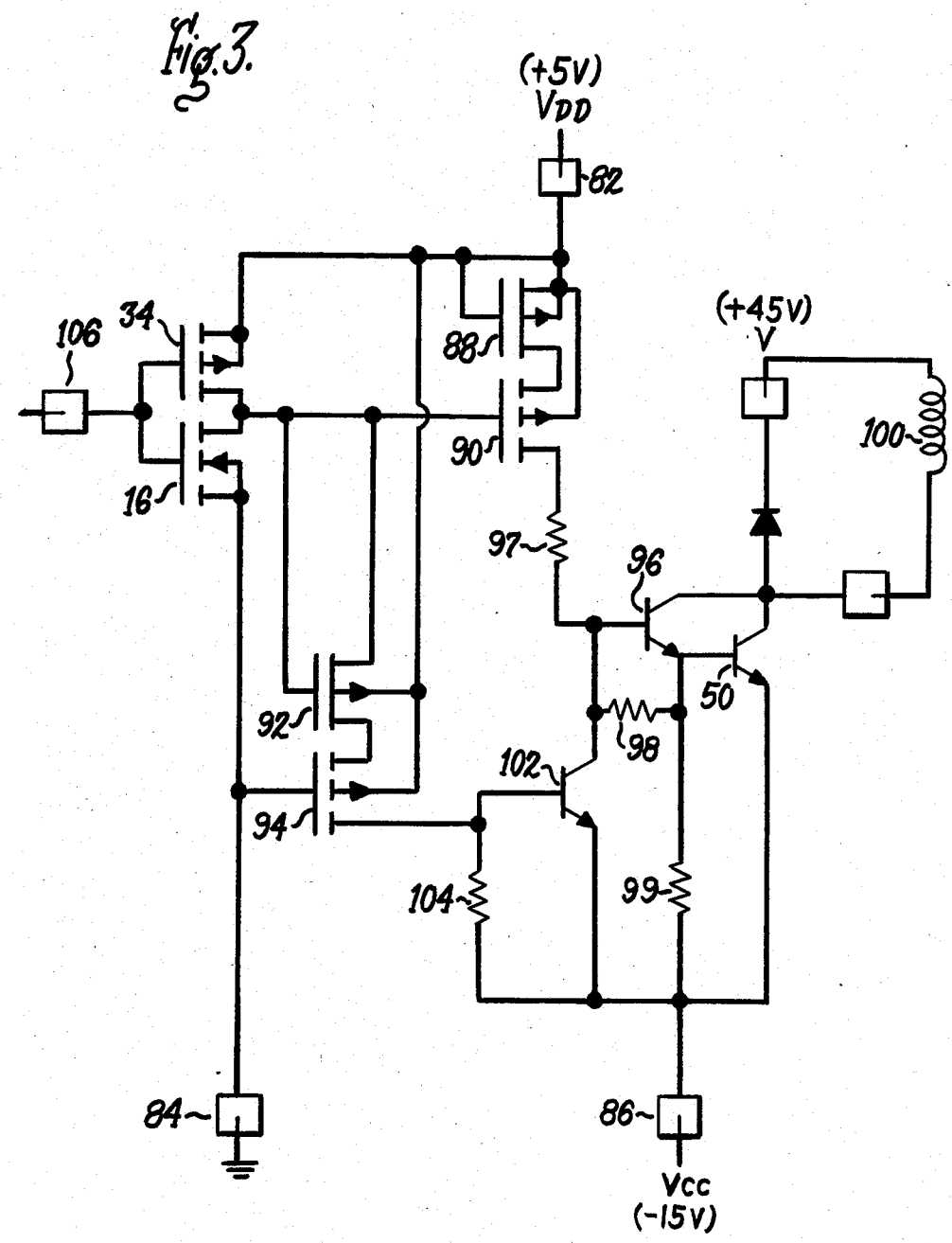
FIG. 3 shows a low power logic circuit employing MOS transistors driving a high power NPN transistor that may be formed in the integrated circuit of FIGS. 1 and 2, wherein the MOS circuit is contained within one epitaxial pocket is operated at a positive voltage and the substrate acting as the ground reference for the relatively high current bipolar transistors operates at a negative voltage.

Referring to FIG. 3, the logic signal output from C-MOS transistors 16 and 34 is connected to the input of a pull-up switch and a pull-down switch. The pull-up switch consists of a depletion mode transistor 88 and an enhancement mode transistor 90. The pull-down switch is composed of a depletion mode transistor 92 and an enhancement mode transistor 94. Transistors 88, 90, 92 and 94 are preferably located in the subpocket 11′a (though not shown there in FIG. 1) as would all other small signal MOS transistors that may be wanted in the circuit.

The output of the pull-up switch is connected to the input of the power darlington pair comprised of NPN transistors 50 and 96 and resistors 97, 98 and 99. The output transistor 50 is actually much larger than shown in FIG. 2, relative to the MOS transistors of FIG. 1, and is capable of delivering current pulses of more than 2 amperes to actuate a print hammer retrieval coil 100. A pull-down NPN transistor 102, with input shunt resistor 104, is driven by the pull-down transistor switch to turn on at the time the power darlington turns off to increase the speed at which the darlington power transistors 50 and 98 can be switched.

The process by which the integrated circuit described above is manufactured includes the following steps performed in the order presented.

The P-type wafer 10 is oxidized to form a temporary silicon dioxide layer over all surfaces, holes are opened in this layer in areas corresponding to the desired locations of the N-type buried layers (e.g. regions 40, 58 and 82). N-type impurities, antimony, are deposited at the face of wafer 10, through the holes. This silicon dioxide masking layer is chemically stripped off and the antimony is driven for 18 hours at 1250° C.

A second masking oxide layer is formed in a similar manner, holes being provided therein through which to selectively deposit P-type impurities, boron, at the face of the wafer in areas corresponding to locations of the P-type buried layers (e.g. regions 12a and 18a). The second masking layer is then removed and the boron is driven at 1175° C. for about one hour.

The epitaxial layer 11 is grown over the above mentioned wafer face by a well known method of heating and exposing the wafer 10 to a gaseous mixture containing a silicon precursor compound (silicon tetrachloride) and a gaseous precursor of N-type impurities (phosphine).

A silicon dioxide mask is formed over the surface of the epitaxial layer 11, and the aforementioned downward extending P-type regions (e.g. 12b and 18b) are preformed by a standard ion implantation predeposition step. Boron is chosen as the dopant.

After removing the last mentioned mask, a new mask is formed and N-type impurities are thereby selectively diffused into the wafer by a standard procedure of heating the wafer and passing over it a gas containing the impurities to preform the guard plug 41. Similarly after removing the last mentioned mask, boron is selectively diffused into the wafer to form the P-type base region 52 as well as regions 12c, 35, 36, 26, 70, 72 and any diffused resistors that may be required in the circuit (not shown). In the same manner phosphorous is selectively diffused to form emitter region 54 as well as other shallow N-type regions 38, 20, 28, 60 and 74. A short oxidation step is then performed to cover the emitter 54 and the other exposed N-type areas.

Standard photolithographic and oxide etching steps are then performed to remove all oxide from the gate regions of the MOS transistors. The critical gate oxidation is now performed in these regions by heating in dry oxygen at 1000° C.

Holes are then photolithiographically opened in the oxide 13 and a sheet of aluminum is deposited by vacuum evaporation over the oxide and through the holes to contact the doped regions at the desired areas. In a further photolithiographic step, the aluminum is selectively removed to leave a network of conductors that make the desired electrical connections as is schematically illustrated in FIGS. 1 and 2.

Although an input terminal pad 106 and other pads, e.g. 83 and 86, are shown in FIG. 3 to indicate connections of the integrated circuit to external circuits, the invention is not meant to be so limited, i.e. other circuits within the integrated circuit may connect directly to the input of the CMOS switch and on board DC voltage sources may provide the DC voltage sources.

What is claimed is:

1. A level shifting BIMOS integrated circuit comprising a silicon substrate of P-type, an N-type epitaxial layer having been grown on a face of said substrate, electrical components formed in said epitaxial layer including a complementary pair of MOS transistors and at least one bipolar transistor, said pair of MOS transistors being formed in a first pocket of said epitaxial layer and said bipolar transistor being formed in a second pocket of said epitaxial layer, a system of P-type isolation walls extending from the surface of and through said epitaxial layer to said P-type substrate and surrounding and defining said epitaxial pockets, an N-type basket in said first pocket comprised of an N-type buried layer formed at said substrate face and partially into said first pocket under said pair of MOS transistors and an N-type plug at least partially around said pair of transistors extending downward through epitaxial layer to said N-type buried layer, the N-channel transistor of said MOS pair including a P-type well region extending from the outer surface of and through said epitaxial layer to said N-type buried layer so that said N-type buried layer is located between said P-type well region and said P-type substrate to electrically isolate one from the other; and a plurality of conductive members overlying said epitaxial layer, one of said conductive members contacting said N-type plug and being adapted for connection to one source of DC voltage, and another and separate of said conductive members contacting said system of P-type isolation walls and being adapted for connection to a source of another DC voltage.

2. The integrated circuit of claim 1 wherein said P-type well is comprised of a buried P-type region extending upward out of said first N-type buried layer into said first epitaxial pocket and a downward diffused P-type region extending downward into said first epitaxial pocket to overlap said buried P-type region.

3. The integrated circuit of claim 2 wherein said isolation walls are comprised of a downward diffused P-type portion having the same impurity concentration and depth as that of said downward diffused P-type region in said well, and a buried P-type portion extending upward into said epitaxial layer from said face the same distance as does said P-type buried region.

4. The integrated circuit of claim 1 wherein said N-type plug is formed completely and continuously around and enclosing said pair of MOS transistors and extends downward everywhere to said N-type buried layer so that said basket is complete and without holes or gaps.

* * * * *